United States Patent
Yanoh et al.

(10) Patent No.: US 10,037,910 B2
(45) Date of Patent: Jul. 31, 2018

(54) WAFER HOLDER AND METHOD FOR MANUFACTURING THE SAME

(71) Applicant: NGK INSULATORS, LTD., Nagoya (JP)

(72) Inventors: Takuya Yanoh, Handa (JP); Kazuma Ohba, Handa (JP); Tetsuya Kawajiri, Handa (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 332 days.

(21) Appl. No.: 15/068,936

(22) Filed: Mar. 14, 2016

(65) Prior Publication Data
US 2016/0196999 A1    Jul. 7, 2016

Related U.S. Application Data

(63) Continuation of application No. PCT/JP2015/075178, filed on Sep. 4, 2015.
(Continued)

(51) Int. Cl.
*H01T 23/00* (2006.01)
*H01L 21/683* (2006.01)
(Continued)

(52) U.S. Cl.
CPC ........ *H01L 21/6833* (2013.01); *B29C 43/206* (2013.01); *C04B 37/008* (2013.01);
(Continued)

(58) Field of Classification Search
CPC .................................................. H01L 21/6833
See application file for complete search history.

(56) References Cited

U.S. PATENT DOCUMENTS 6,256,187 B1 *  7/2001  Matsunaga .............. B23Q 3/00
                                                279/128
7,881,036 B2 *  2/2011  Fujisawa ................. H01L 21/68
                                                279/128
(Continued)

FOREIGN PATENT DOCUMENTS

CN      101952952 A      1/2011
JP      2003-142567 A1   5/2003
(Continued)

OTHER PUBLICATIONS

Taiwanese Office Action (Application No. 104129298) dated Nov. 22, 2016.
(Continued)

*Primary Examiner* — Stephen W Jackson
(74) *Attorney, Agent, or Firm* — Burr & Brown, PLLC

(57) ABSTRACT

A wafer holder 10 includes a resin adhesive layer 16 between a ceramic electrostatic chuck 12 and a metal cooling plate 14. The adhesive layer 16 includes a first layer 16a in contact with the electrostatic chuck 12, a second layer 16b in contact with the cooling plate 14, and an intermediate layer 16c located between the first layer 16a and the second layer 16b. Heat resistance of each of the first layer 16a and the intermediate layer 16c is higher than heat resistance of the second layer 16b, flexibility of the second layer 16b is higher than flexibility of each of the first layer 16a and the intermediate layer 16c, and the layers are in hermetic contact with each other.

8 Claims, 2 Drawing Sheets

Related U.S. Application Data

(60) Provisional application No. 62/045,745, filed on Sep. 4, 2014.

(51) Int. Cl.
  *B29C 43/20* (2006.01)
  *C04B 37/02* (2006.01)
  *H01L 21/67* (2006.01)
  *H01L 21/687* (2006.01)
  *C04B 37/00* (2006.01)
  *B29K 33/00* (2006.01)
  *B29K 63/00* (2006.01)
  *B29L 31/00* (2006.01)
  *B29C 43/18* (2006.01)
  *B29C 43/36* (2006.01)

(52) U.S. Cl.
  CPC ...... *C04B 37/028* (2013.01); *H01L 21/67103* (2013.01); *H01L 21/6831* (2013.01); *H01L 21/68757* (2013.01); *H01L 21/68785* (2013.01); *B29C 43/18* (2013.01); *B29C 2043/3644* (2013.01); *B29K 2033/08* (2013.01); *B29K 2033/12* (2013.01); *B29K 2063/00* (2013.01); *B29L 2031/7502* (2013.01); *C04B 2235/96* (2013.01); *C04B 2237/366* (2013.01); *C04B 2237/402* (2013.01); *C04B 2237/708* (2013.01); *C04B 2237/72* (2013.01)

(56) References Cited

U.S. PATENT DOCUMENTS

| | | | |
|---|---|---|---|
| 9,330,953 B2 * | 5/2016 | Miura | H01L 21/6833 |
| 2011/0058303 A1 | 3/2011 | Migita | |
| 2013/0148253 A1 | 6/2013 | Komatsu et al. | |
| 2014/0272421 A1 | 9/2014 | Ohba et al. | |

FOREIGN PATENT DOCUMENTS

| | | |
|---|---|---|
| JP | 2009-071023 A1 | 4/2009 |
| JP | 2012-129539 A1 | 7/2012 |
| JP | 2013-120835 A1 | 6/2013 |
| JP | 2014-183077 A1 | 9/2014 |

OTHER PUBLICATIONS

Wakariyasui Secchaku Gijutu Dokuhon, Hichakuzai kara Mita Secchaku Gijutu, Kinzoku Zairyou Hen, "Easy-to-follow Guide of Adhesive Technology, Adhesive Technology Seen from Adherend, Metal Materials," published on Mar. 2003 by Nikkan Kogyo Shimbun, Ltd., pp. 15-19, 28-39 and 45-49.

Omoshiro Banashi de Rikaisuru Zairyou Rikigaku Nyumon, "Introduction of Material Mechanics Understood from Interesting Stories," published on Nov. 2005 by Nikkan Kogyo Shimbun, Ltd., pp. 33-34 and 60-62.

Etoki de Wakaru Zairyou Rikigaku, "Illustrative Handbook of Material Mechanics," published on Aug. 2007 by Ohmsha, Ltd., pp. 20-27.

Frequently Asked Questions (Q&A), Kapton (registered trademark), manufactured by Toray duPont Co., Ltd., pp. 1 to 4, [printed on Oct. 11, 2016], the Internet <URL: http://www.td-net.co.jp/kapton/faq.html>.

Super Heat Resistant and Super Cold Resistant Polyimide Film, Kapton (registered trademark), manufactured by Toray duPont Co., Ltd., pp. 1 to 10, [printed on Dec. 8, 2016], the Internet <URL: http://www.td-net.co.jp/products/download/documents/kapton2007.pdf>.

Japanese Notice of Sending Duplicate of Written Opposition (Opposition No. 2017-700004; U.S. Pat. No. 5,948,513) dated Feb. 1, 2017 (with English translation).

Japanese Notice of Reasons for Revocation (Opposition No. 2017-700004; U.S. Pat. No. 5,948,513) dated Mar. 30, 2017 (with English translsation).

English Translation of International Preliminary Report on Patentability, International Application No. PCT/JP2015/075178, dated Mar. 16, 2017 (7 pages).

International Search Report and Written Opinion (Application No. PCT/JP2015/075178) dated Nov. 17, 2015.

\* cited by examiner

WAFER HOLDER AND METHOD FOR MANUFACTURING THE SAME

BACKGROUND OF THE INVENTION

1. Field of the Invention

The present invention relates to a wafer holder and a method for manufacturing the same.

2. Description of the Related Art

In wafer holders in which a ceramic electrostatic chuck (electrostatic chuck heater, susceptor) is bonded to a metal cooling plate, a resin adhesive tape or an adhesive material is typically used for bonding the electrostatic chuck to the cooling plate (for example, PTL 1). The operation temperature of such a wafer holder is limited on the basis of the heat resistance of the resin (in general, 100° C. or lower, and even in the case of high-temperature grade, 150° C. or lower at the best). It is difficult to use a heat-resistant resin as the wafer holder because the modulus of elasticity of the resin is high and a difference in thermal expansion between the ceramics and the cooling plate cannot be absorbed, so that deformation or cracking occurs. In the case of joining with a brazing metal or the like, it is possible to use at high temperatures insofar as joining can be conducted. However, if the thermal expansion of the ceramics and the thermal expansion of the cooling plate (metal) are not equalized with each other, deformation or cracking occurs in the time of joining.

On the other hand, PTL 2 discloses an apparatus in which a heat-resistant layer, an adhesive layer, and a heat-insulating layer are disposed between a ceramic substrate and a base plate including a water channel. The heat-resistant layer is made of, for example, an insulating resin, e.g., polyimide, or an inorganic adhesive containing an inorganic material, e.g., low-melting glass, alumina, or silica, as a base. The adhesive layer and the heat-insulating layer are made of insulating resins, e.g., silicone. In order to produce such an apparatus, initially, the heat-insulating layer is formed on the base plate. Specifically, an insulating resin, e.g., silicone, including a filler is laminated on the base plate, and the resin is cured by heating to a curing temperature or higher while being pressed, as necessary. Subsequently, the heat-resistant layer is formed on one surface of the ceramic substrate. When forming the heat-resistant layer, a material on a film may be laminated and cured, or a liquid or paste material may be applied and cured. Then, the adhesive layer is formed on the heat-insulating layer. Before the adhesive layer is cured, the ceramic substrate is mounted on the adhesive layer so that the heat-resistant layer side of the ceramic substrate comes into contact with the adhesive layer. Thereafter, the adhesive layer is cured by being heated to the curing temperature or higher. The operation temperature of such an apparatus can be increased than ever. Also, the adhesive layer having the flexibility is disposed and, therefore, even in the case where a stress is generated at the time of heating, the resulting stress can be relaxed by the adhesive layer.

CITATION LIST

Patent Literature

PTL 1: JP 2009-71023 A
PTL 2: JP 2013-120835 A

SUMMARY OF THE INVENTION

However, in the apparatus of PTL 2, the adhesive layer is more flexible (low modulus of elasticity) than the heat-resistant layer and, therefore, peeling may occur between the adhesive layer and the heat-insulating layer and between the adhesive layer and the heat-resistant layer. One of the causes is considered to be that in the production process of the apparatus, the adhesive layer before curing is sandwiched between the heat-resistant layer and the heat-insulating layer, the adhesive layer is cured by being heated in that state, and thereby, bubbles easily enter between the layers because the adhesive layer before curing tends to be deformed and the flatness cannot be maintained.

The present invention was made to solve the above-described issues and a main object is to provide a wafer holder in which a good adhesion state can be maintained between an electrostatic chuck and a cooling plate even at high temperatures.

A wafer holder according to the present invention includes a resin adhesive layer between a ceramic electrostatic chuck and a metal cooling plate, wherein the adhesive layer includes a first layer in contact with the electrostatic chuck, a second layer in contact with the cooling plate, and an intermediate layer located between the first layer and the second layer, heat resistance of each of the first layer and the intermediate layer is higher than heat resistance of the second layer, flexibility of the second layer is higher than flexibility of each of the first layer and the intermediate layer, and the layers are in hermetic contact with each other.

In the wafer holder according to the present invention, the first layer, which is in contact with the electrostatic chuck, in the adhesive layer is responsible for the heat resistance and the second layer, which is in contact with the cooling plate, in the adhesive layer is responsible for the flexibility, that is, stress relaxation. In general, a resin material exhibiting high heat resistance has a high modulus of elasticity. Therefore, in the case where this is used as a material for the adhesive layer between ceramics and a metal, a difference in thermal expansion between the two is not absorbed easily and deformation or cracking occurs easily. On the other hand, in general, a resin material exhibiting high flexibility exhibits low heat resistance. Therefore, in the case where this is used as a material for the adhesive layer between ceramics and a metal, embrittlement occurs because of the heat and peeling occurs easily. In consideration of this, in the present invention, the first layer is responsible for the heat resistance, the second layer on the cooling plate side is responsible for the flexibility, and thereby, the balance between the heat resistance and the stress relaxation is achieved. In addition, the intermediate layer between the first layer and the second layer is composed of the resin material exhibiting high heat resistance, that is, a hard-to-deform resin material having a high modulus of elasticity. Therefore, at the stage of formation of the adhesive layer by thermal curing, the air does not enter between the layers and the layers came into the state of being in hermetic contact with each other after the thermal curing. Consequently, peeling between the layers does not occur even in a high temperature state. Therefore, according to the wafer holder of the present invention, a good adhesion state can be maintained between the electrostatic chuck and the cooling plate even at high temperatures (for example, 150° C. or higher).

A method for manufacturing the wafer holder according to the present invention includes forming a layer of first layer precursor, which becomes the first layer through thermal curing, on one surface of the electrostatic chuck, forming a layer of second layer precursor, which becomes the second layer through thermal curing, on one surface of the cooling plate, forming a laminate by sandwiching a thermally cured flat resin sheet, which corresponds to the intermediate layer, between the layer of first layer precursor on the electrostatic chuck and the layer of second layer precursor on the cooling plate, and thermally curing the layer of first layer precursor and the layer of second layer precursor by putting the laminate into a bag, decompressing the inside of the bag, and pressurizing and heating the bag from the outside.

In the manufacturing method, the laminate, in which the thermally cured flat resin sheet corresponding to the intermediate layer is sandwiched between the layer of first layer precursor on the electrostatic chuck and the layer of second layer precursor on the cooling plate, is put into the bag, the inside of the bag is decompressed, and heating is performed on the bag with the laminate inside under pressure so as to thermally cure the layer of first layer precursor and the layer of second layer precursor. Consequently, the air does not enter between the layers at the stage of production of the laminate. As a result, the layers come into the state of being in hermetic contact with each other after the thermal curing. Therefore, peeling between the layers does not occur in the resulting wafer holder even in a high temperature state. It can be said that such a manufacturing method is suitable for obtaining the wafer holder according to the present invention.

DETAILED DESCRIPTION OF THE INVENTION

Figure 1:
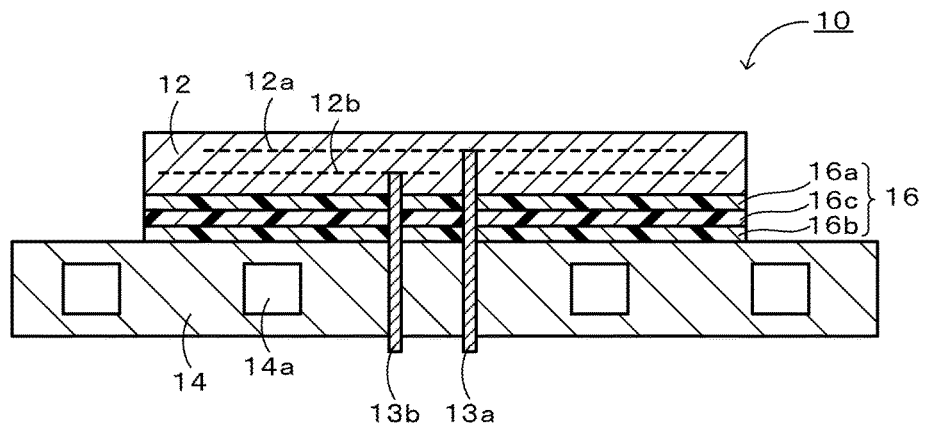
FIG. 1 is a sectional view of a wafer holder 10.

An embodiment of a wafer holder according to the present invention is illustrated in FIG. 1. FIG. 1 is a sectional view of a wafer holder 10.

The wafer holder 10 includes a resin adhesive layer 16 between a ceramic electrostatic chuck 12 and a metal cooling plate 14.

As for the electrostatic chuck 12, a known electrostatic chuck can be used, where an electrostatic electrode 12a and a heater electrode 12b are incorporated in an alumina or aluminum nitride ceramic base material. An electric power is fed to the electrostatic electrode 12a from the outside with a power feeding member 13a penetrating the adhesive layer 16 and the cooling plate 14. Also, an electric power is fed to the heater electrode 12b from the outside with a power feeding member 13b penetrating the adhesive layer 16 and the cooling plate 14. In this regard, each of the power feeding member 13a and the power feeding member 13b is electrically insulated from the cooling plate 14. The upper surface of the electrostatic chuck 12 is a surface on which a wafer is placed. The placed wafer is adsorbed and held on the surface by an electrostatic force of the electrostatic electrode 12a and, in addition, is heated by the heater electrode 12b.

As for the cooling plate 14, a known cooling plate can be used, where a refrigerant channel 14a, in which a refrigerant, e.g., a cooling liquid, can be circulated, is incorporated. The cooling plate 14 is produced from a material, for example, a metal material, e.g., aluminum or an aluminum alloy, having good thermal conductivity. The cooling plate 14 has the refrigerant channel 14a therein and, therefore, even in the case where the temperature of the electrostatic chuck 12 is raised, the cooling plate 14 is set at a low temperature by the refrigerant (for example, a cooling liquid).

The adhesive layer 16 includes a first layer 16a in contact with the electrostatic chuck 12, a second layer 16b in contact with the cooling plate 14, and an intermediate layer 16c located between the first layer 16a and the second layer 16b. The adhesive layer 16 is sandwiched between the electrostatic chuck 12 at a high temperature and the cooling plate 14 at a low temperature and, therefore, a temperature distribution is generated inside the adhesive layer 16. Accordingly, materials resistant to temperatures in accordance with the temperature distribution are used for the individual layers constituting the adhesive layer 16. The first layer 16a and the intermediate layer 16c are close to the electrostatic chuck 12 that generates heat and, therefore, the temperatures easily become high as compared with the second layer 16b, so that materials exhibiting heat resistance higher than the heat resistance of the second layer 16b are used for the first layer 16a and the intermediate layer 16c. The second layer 16b is close to the cooling plate 14 and the temperature easily becomes low as compared with the first layer 16a and the intermediate layer 16c, so that a material having flexibility higher than the flexibility of each of the first layer 16a and the intermediate layer 16c is used for the second layer 16b so as to relax the stress generated because of the difference in thermal expansion between the electrostatic chuck 12 and the cooling plate 14. Also, the first layer 16a is in hermetic contact with the intermediate layer 16c and the intermediate layer 16c is in hermetic contact with the second layer 16b. Here, the term "hermetic contact" refers to the state in which no bubble having a diameter of 1 mm or more is present between layers and the number of bubbles having a diameter of less than 1 mm is 20 or less every 706.5 cm$^2$. For example, in the case where the adhesive layer 16 is seen through the upper surface of the electrostatic chuck 12 or the adhesive layer 16 is seen through the lower surface of the cooling plate 14, presence/absence of bubbles may be visually examined. Alternatively, the wafer holder 10 is put into pure water and presence/absence of bubbles may be examined with an ultrasonic flaw detector. Presence/absence of bubbles can be determined with the ultrasonic flaw detector regardless of whether the electrostatic chuck 12 or the cooling plate 14 is transparent or not.

Preferably, the first layer 16a and the intermediate layer 16c are a polyimide resin layer, an epoxy resin layer, or a PEEK (polyether ether ketone) resin layer, which exhibits heat resistance at 200° C. (preferably 250° C.). The polyimide resin layer is a resin layer containing a high molecular material having at least an imide bond. The epoxy resin layer is a resin layer containing a three-dimensional cured material generated by a reaction between a prepolymer having a reactive epoxy group and a curing agent. Examples of prepolymers include those capable of performing hydrogen transfer polyaddition. This is because the temperatures of the first layer 16a and the intermediate layer 16c may be raised to such a temperature by heat transfer from the electrostatic chuck 12 and, in addition, each of the polyimide resin, the epoxy resin, and the PEEK resin exhibits excellent heat resistance. Preferably, the intermediate layer 16c is a flat resin sheet because the layers thereby come into hermetic contact with each other easily.

Preferably, the second layer 16b is an epoxy-acryl mixed resin layer and the shear modulus of elasticity Z (MPa) at room temperature preferably satisfies 0.048≤Z≤2.350. This is because in the case where the shear modulus of elasticity Z of the second layer is within the above-described range, even when a shear stress due to a difference in thermal expansion between the electrostatic chuck 12 and the cooling plate 14 is generated in the adhesive layer 16 at high temperatures, the stress can be relaxed. In this regard, such an epoxy-acryl mixed resin layer is disclosed in, for example, Japanese Unexamined Patent Application Publication No. 2014-183077. The first layer 16a and the intermediate layer 16c have the moduli of elasticity Z larger than the modulus of elasticity Z of the second layer 16b and, therefore, are hard and less flexible as compared with the second layer 16b. Preferably, the thickness of the second layer 16b is smaller than the total thickness of the first layer 16a and the intermediate layer 16c, preferably, for example, 100 to 500 μm, and more preferably 150 to 400 μm. In the case where the thickness of the second layer 16b is 150 to 400 μm, resistance to higher temperature can be exhibited as compared with the case where the thickness is 100 to 500 μm.

Preferably, the second layer 16b is produced by curing an epoxy-acryl mixed adhesive. Such an adhesive may contain (A) an epoxy resin capable of performing hydrogen transfer polyaddition (prepolymer), (B) a polymer of acrylic acid ester or methacrylic acid ester (prepolymer), and (C) a curing agent. The components and the composition of the adhesive will be described below.

Examples of the epoxy resin, which is the component (A), capable of performing hydrogen transfer polyaddition include bisphenol A epoxy resins, bisphenol F epoxy resins, bisphenol AD epoxy resins, phenol novolac epoxy resins, and cresol novolac epoxy resins. The above-described epoxy resins do not generate or hardly generate low molecular substances in the curing reaction.

Examples of the polymer of acrylic acid ester or methacrylic acid ester, which is the component (B), include epoxy-containing acrylic rubber containing an alkyl acrylate or an alkyl methacrylate as a primary component and carboxyl-containing acrylic rubber containing an alkyl acrylate or an alkyl methacrylate as a primary component. The above-described polymers do not generate or hardly generate low molecular substances in the curing reaction.

Examples of the curing agent, which is the component (C), include DICY (dicyandiamide) curing agents, imidazole curing agents, and amine curing agents.

The composition of the adhesive may contain, for example, 5 to 80 percent by mass of component (A), 15 to 90 percent by mass of component (B), and 0.1 to 5 percent by mass of component (C). In particular, in the case where a hole is disposed in the cooling plate 14 and suppression of the adhesive being pushed into the hole is intended, it is preferable that the percent by mass of the component (A) be made smaller than the percent by mass of the component (B), and it is more preferable that 19 to 36 percent by mass of component (A), 60 to 80 percent by mass of component (B), and 1 to 4 percent by mass of component (C) be contained. In this regard, less than 1 percent by mass of carboxyl-terminated butadiene-acrylonitrile copolymer liquid rubber (CTBN) may be added as another component.

Examples of the adhesive sheet for the second layer 16b, that is, the layer 26b of second layer precursor, are shown in the following items (1) to (5). In this regard, such adhesive sheets are made into a sheet shape by vaporizing volatile solvents (acetone, hexane, and the like) from adhesives in which the individual components are diluted with the volatile solvents. The shear modulus of elasticity Z of each of them measured after thermal curing is about 0.23.

Figure 2:
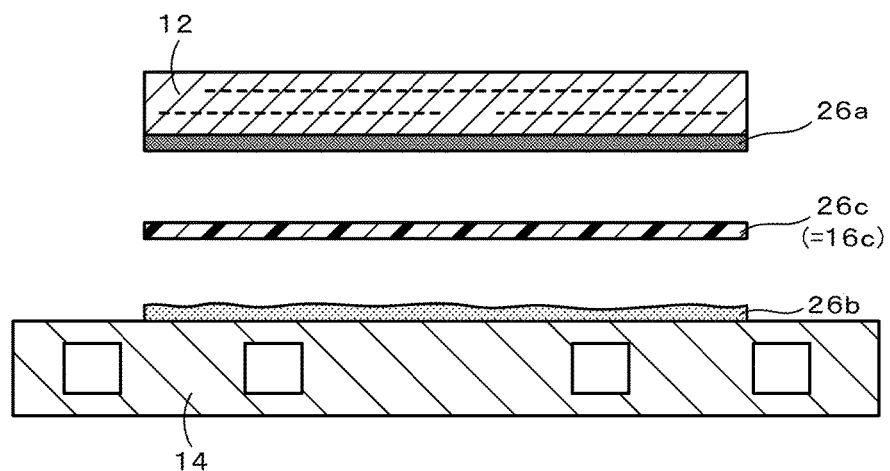
FIG. 2 is a production process diagram of the wafer holder 10.

(1) Adhesive sheet containing 19 percent by mass of bisphenol F epoxy resin, 80 percent by mass of epoxy-containing acrylic rubber that contains butyl acrylate as a primary component, and 1 percent by mass of DICY (dicyandiamide) curing agent (2) Adhesive sheet containing 29 percent by mass of cresol novolac epoxy resin, 70 percent by mass of epoxy-containing acrylic rubber that contains ethyl acrylate as a primary component, and 1 percent by mass of imidazole curing agent (3) Adhesive sheet containing 36 percent by mass of bisphenol A epoxy resin, 60 percent by mass of carboxyl-containing acrylic rubber that contains butyl acrylate as a primary component, and 4 percent by mass of amine curing agent (4) Adhesive sheet containing 57 percent by mass of bisphenol F epoxy resin, 40 percent by mass of epoxy-containing acrylic rubber that contains butyl acrylate as a primary component, and 3 percent by mass of DICY curing agent (5) Adhesive sheet containing 76 percent by mass of bisphenol F epoxy resin, 20 percent by mass of epoxy-containing acrylic rubber that contains butyl acrylate as a primary component, and 4 percent by mass of DICY curing agent Next, an example of the method for manufacturing the above-described wafer holder 10 will be described below. Here, for the sake of convenience, explanations of the power feeding members 13a and 13b will not be provided. FIG. 2 is a production process diagram of the wafer holder 10.

Initially, a layer 26a of first layer precursor, which becomes the first layer 16a through thermal curing, is formed on one surface of the electrostatic chuck 12. In addition, a layer 26b of second layer precursor, which becomes the second layer 16b through thermal curing, is formed on one surface of the cooling plate 14. Also, a thermally cured flat resin sheet 26c, which corresponds to the intermediate layer 16c, is prepared. The resin sheet 26c has been cured and, therefore, exhibits no adhesive property. Subsequently, a laminate is formed by sandwiching the flat resin sheet 26c between the layer 26a of first layer precursor on the electrostatic chuck 12 and the layer 26b of second layer precursor on the cooling plate 14. The resulting laminate is put into a bag, the inside of the bag is decompressed, and the bag is heated while being pressurized in an autoclave. Consequently, the layer 26a of first layer precursor and the layer 26b of second layer precursor are thermally cured so as to be the first layer 16a and the second layer 16b, respectively. The layer 26a of first layer precursor is heated so as to be softened or melted and, thereafter, bond the electrostatic chuck 12 and the flat resin sheet 26c, that is, intermediate layer 16c, while being cured by cooling. Also, the layer 26b of second layer precursor is heated so as to be softened or melted and, thereafter, bond the cooling plate 14 and the flat resin sheet 26c, that is, intermediate layer 16c, while being cured by cooling. At this time, generation of bubbles between the layers after thermal curing can be prevented because the flat resin sheet 26c, which has been thermally cured, is interposed between the layer 26a of first layer precursor and the layer 26b of second layer precursor.

In the above-described wafer holder 10, the first layer 16a on the electrostatic chuck 12 side is responsible for the heat resistance and the second layer 16b on the cooling plate 14 side is responsible for the flexibility. Meanwhile, the intermediate layer 16c between the first layer 16a and the second layer 16b is a resin material exhibiting high heat resistance, that is, a hard-to-deform resin material having a high modulus of elasticity. Therefore, at the stage of formation of the adhesive layer 16 by thermal curing, the air does not enter between the layers and the layers come into hermetic contact with each other after the thermal curing. Consequently, peeling does not occur between the layers even in a high temperature state. Therefore, according to the wafer holder 10, a good adhesion state can be maintained between the electrostatic chuck 12 and the cooling plate 14 even at high temperatures (for example, 150° C. or higher).

Note that, needless to say, the present invention is not limited to the above-described embodiment and can be executed in various forms within the technical scope of the present invention.

For example, in the above-described embodiment, in the case where the surface temperature of the electrostatic chuck 12 is 200° C., the temperature of the cooling plate 14 is 100° C., and the thickness of the adhesive layer 16 is 0.4 mm (the thermal conductivity is uniform), the temperature of the midpoint of the adhesive layer 16, when viewed in the thickness direction, is 150° C. In this case, it is preferable that the first layer 16a exhibit heat resistance at 200° C. (preferably 250° C.) and the second layer 16b exhibit heat resistance at 150° C. As described above, preferably, the heat-resistant temperature of each of the layers is appropriately set in accordance with actual temperatures of the electrostatic chuck 12 and the cooling plate 14.

Although one intermediate layer 16c is interposed between the first layer 16a and the second layer 16b in the above-described wafer holder 10, two or more intermediate layers 16c may be disposed in consideration of, for example, the temperature and the design.

EXAMPLES

1. Production of Wafer Holder Sample

Experimental Examples 1 to 13

Experimental examples 1 to 13 are examples in which a heat-resistant resin was used as the first layer and the intermediate layer and a flexible resin was used as the second layer. The sample of the wafer holder of each of Experimental examples was prepared in the following procedure. In the sample, the power feeding members 13a and 13b illustrated in FIG. 1 were not provided. Initially, an uncured, easy-to-deform adhesive sheet, which was a precursor of a stress relaxing layer was stuck on an Al cooling plate having a water channel and a diameter of 300 mm. Here, the adhesive sheet (3) described in the paragraphs of the embodiment according to the present invention was used as the adhesive sheet. Subsequently, a flat resin sheet serving as an intermediate layer was stuck on the adhesive sheet. The flat resin sheet was a thermally cured heat-resistant resin sheet exhibiting no adhesiveness and was able to maintain the flatness. Thereafter, an uncured adhesive sheet, which was a precursor of a heat-resistant layer, was stuck on the flat resin sheet. In this regard, in the case where the precursor of the heat-resistant layer was in the state of a paste (for example, an epoxy base), the flat resin sheet was coated with the paste. Then, a laminate was produced by sticking a ceramic substrate, in which an electrode was embedded and which had a diameter of 300 mm and a thickness of 4 to 5 nm, on the precursor of the heat-resistant layer. Subsequently, the resulting laminate was wrapped with a highly heat-resistant cloth. This was further put into a resin bag for bagging, and the inside of the bag was evacuated. The evacuated bag was put into an autoclave, and adhesion was performed at 150° C. to 180° C. and 1.0 MPa. Consequently, the precursor of the stress relaxing layer and the precursor of the heat-resistant layer were thermally cured and became the stress relaxing layer and the heat-resistant layer, respectively, so that the sample of the wafer holder was completed. Thereafter, the sample of the wafer holder was taken off the autoclave. The specific material and thickness of each layer employed in Experimental examples 1 to 13 are shown in Table 1.

Figure 3:
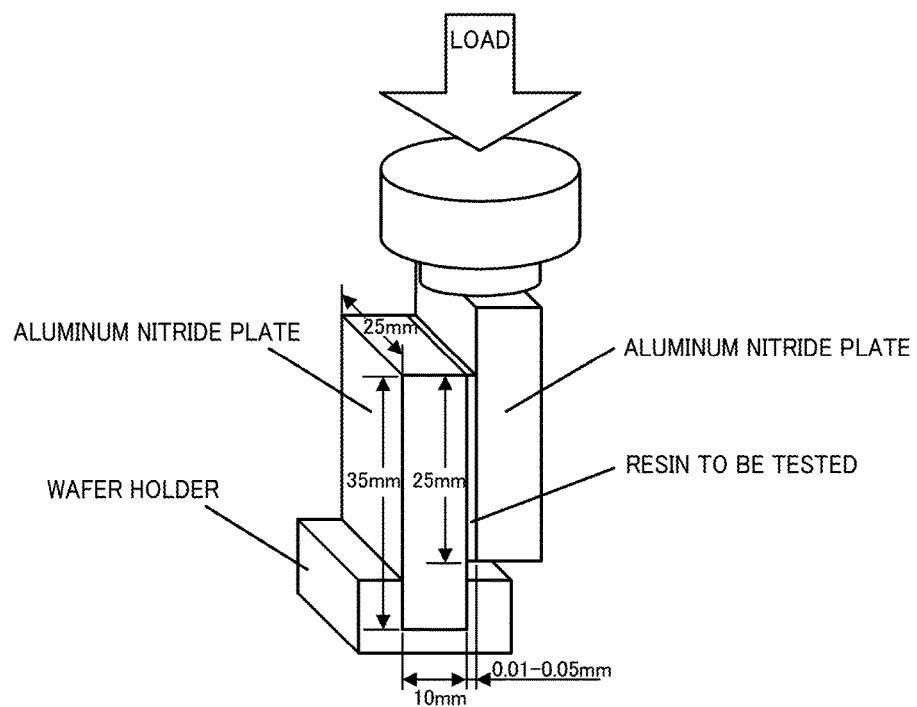
FIG. 3 is an explanatory diagram of a shear tester.

The heat-resistant resin used for the heat-resistant layer and the intermediate layer was selected as described below. As illustrated in FIG. 3, two aluminum nitride plates of 25 mm long×35 mm wide×10 mm thick were prepared, the two aluminum nitride plates were bonded in a staggered configuration by the resin to be tested, so that a bonded body for a shear test was produced. The resin portion was 25 mm long×25 mm wide×0.01 to 0.40 mm thick. In this regard, in the case where the thickness was within this range, the obtained results were empirically substantially the same. The shear test was performed by placing the bonded body with the surface of 25 mm×10 mm of one aluminum nitride plate of the bonded body down on the wafer holder and applying a vertical, downward load (force) to the other aluminum nitride plate. The test temperature was 250° C. or 200° C. and the atmosphere was an air atmosphere. In such a shear test, measurements were performed before and after application of a heat history. The shear strength was determined on the basis of the results of the shear test. Regarding the heat history, the bonded body for the shear test was exposed to the same temperature and the same atmosphere as those in the test for 1,000 hours. According to the stress calculation, the shear strength required at 250° C. or 200° C. was 0.3 MPa or more. Therefore, it was judged that a resin having shear strength of 0.3 MPa or more exhibited the heat resistance at 250° C. or 200° C. In Table 1, the heat-resistant resins (polyimide base, epoxy base, and PEEK) used for the heat-resistant layer and the intermediate layer exhibited the heat resistance at 250° C. and 200° C. In this regard, the silicone base exhibited no heat resistance at 250° C. and 200° C.

The shear modulus of elasticity Z (MPa) (=strength/strain) of the resin was calculated by using the shear strength (MPa) and the shear strain obtained by the above-described shear test at room temperature.

Meanwhile, in the above-described shear test, one aluminum nitride plate was changed to an aluminum plate having the same dimension, and the three-layer structure (the first layer was made to adhere to the aluminum nitride plate and the second layer was made to adhere to the aluminum plate) according to the present invention was adopted as the bonding layer for bonding the aluminum nitride plate to the aluminum plate. As a result, the elongation of the second layer was larger than those of the first layer and the intermediate layer. Consequently, it was ascertained that the second layer had large flexibility and small modulus of elasticity as compared with other layers. In this regard, the adhesive layer of a product of the wafer holder can be evaluated in the same manner by cutting a sample from the product and performing the above-described shear test.

Experimental Examples 14 to 18

Experimental examples 14 to 18 are examples in which the adhesive layer was formed from only the first layer composed of the heat-resistant resin (that is, a single layer). In these examples, samples of wafer holders were produced in the same manner as in Experimental examples 1 to 13 except that the adhesive sheet, which was the precursor of the second layer, was not stuck to the cooling plate and the flat resin sheet serving as the intermediate layer was not used. The specific material and thickness of the first layer employed in Experimental examples 14 to 18 are shown in Table 1.

Experimental Examples 19 to 23

Experimental examples 19 to 23 are examples in which the adhesive layer was formed from the first layer composed of the heat-resistant resin and the second layer composed of the flexible resin (that is, two layers). In these examples, samples of wafer holders were produced in the same manner as in Experimental examples 1 to 13 except that the flat resin sheet serving as the intermediate layer was not used. The specific material and thickness of each layer employed in Experimental examples 19 to 23 are shown in Table 1.

2. Evaluation Test

Amount of Warp

The sample of the wafer holder of each experimental example with the surface of the ceramic substrate down was placed on a horizontal stage, and Z coordinates of 85 points of the surface of the ceramic substrate were measured with a coordinate measuring machine. The difference between the maximum value and the minimum value of the measured Z coordinates was determined as the flatness (amount of warp (μm)). The sample having an amount of warp of 50 μm or less was judged to be usable. The initial (immediately after production) amount of warp of each experimental example was shown in Table 1.

Presence/Absence of Bubbles

Regarding each experimental example, a sample using glass (glass sample) was produced instead of the ceramic substrate. The glass sample was visually observed from the glass side so as to examine presence/absence of bubbles. In addition, the glass sample was put into pure water, and presence/absence of bubbles was examined with an ultrasonic flaw detector. As for the ultrasonic flaw detector, 25 MHz of pulsed wave was applied to the product in the pure water, and presence/absence of bubbles was examined on the basis of presence/absence of reflected wave, where a reflected wave was generated in a portion including bubbles because of change in a medium. Specifically, the case where there was no bubble having a diameter of 1 mm or more and the number of bubbles having a diameter of less than 1 mm was 20 or less every 706.5 $cm^2$ was judged to be no bubble. In the ultrasonic flaw detector, the diameter and the number of bubbles were examined using the image displayed on a display. In this regard, presence/absence of bubbles may be judged at least one of visual inspection and the ultrasonic flaw detector because the results of the visual inspection and the ultrasonic flaw detector are the same. The presence/absence of bubbles at the initial stage of each experimental example is shown in Table 1.

Soaking (Standing of Sample in High-Temperature Environment)

The sample of wafer holder of each experimental example was set in a vacuum chamber, and cooling water was passed through the cooling plate. A heater was set on the upper surface of the ceramic substrate. Subsequently, the ceramic lower surface was adjusted at a predetermined high temperature (250° C. or 200° C.), the cooling plate upper surface was adjusted at 100° C., and standing for 1,000 hours was performed in that state. After the soaking, the amount of warp and bubbles of the wafer holder of each experimental example were measured. The results are shown in Table 1.

In this regard, Table 1 shows the highest temperature of the second layer at 200° C. and the highest temperature of the second layer at 250° C. They were determined from the temperature of the ceramic lower surface, the temperature of the cooling plate upper surface, and the thickness of the layer.

TABLE 1

| Experimental Example | Number of Layer | First Layer (Adhesive) | | | Intermediate Layer (Resin Sheet) | | | Second Layer (Adhesive) | | |
|---|---|---|---|---|---|---|---|---|---|---|
| | | Material | Elastic Modulus Z | Thickness (μm) | Material | Elastic Modulus Z | Thickness (μm) | Material | Elastic Modulus Z | Thickness (μm) |
| 1 | Three Layers | Polyimide base | 0.7 or more | 10 | Polyimide base | 0.7 or more | 390 | Epoxy-Acryl base | 0.23 | 100 |
| 2 | | | | | | | | | | 150 |
| 3 | | | | | | | | | | 200 |
| 4 | | | | | | | | | | 300 |
| 5 | | | | | | | | | | 400 |
| 6 | | | | | | | | | | 500 |
| 7 | | | | 25 | | | 375 | | | 200 |
| 8 | | | | 350 | | | 50 | | | 200 |
| 9 | | | | 10 | | | 140 | | | 150 |
| 10 | | | | 10 | | | 190 | | | 200 |
| 11 | | Polyimide base | 0.7 or more | 10 | PEEK | 0.7 or more | 390 | | | 200 |
| 12 | | Epoxy base | 0.7 or more | 10 | Polyimide base | 0.7 or more | 390 | | | 200 |
| 13 | | Epoxy base | 0.7 or more | 10 | PEEK | 0.7 or more | 390 | | | 200 |
| 14 | Single Layer | Polyimide base | 0.7 or more | 50 | — | — | — | — | — | — |
| 15 | | Polyimide base | | 400 | — | — | — | — | — | — |
| 16 | | Epoxy base | 0.7 or more | 50 | — | — | — | — | — | — |
| 17 | | Epoxy base | | 200 | — | — | — | — | — | — |
| 18 | | Epoxy base | | 400 | — | — | — | — | — | — |
| 19 | Two Layers | Polyimide base | 0.7 or more | 50 | — | — | — | Epoxy-Acryl base | 0.23 | 200 |
| 20 | | Polyimide base | | 400 | — | — | — | | | 200 |
| 21 | | Epoxy base | 0.7 or more | 50 | — | — | — | | | 200 |
| 22 | | Epoxy base | | 200 | — | — | — | | | 200 |
| 23 | | Epoxy base | | 400 | — | — | — | | | 200 |

| Evaluation Results of Properties | Highest | Highest |

TABLE 1-continued

| Experimental Example | Initial Property | | Property After 200° C. Soaking | | Property After 250° C. Soaking | | Temperature of Second Layer at 200° C. (° C.) | Temperature of Second Layer at 250° C. (° C.) |
|---|---|---|---|---|---|---|---|---|
| | Amount of Warp (μm) | Bubbles | Amount of Warp (μm) | Bubbles | Amount of Warp (μm) | Bubbles | | |
| 1 | 48 | Absent | 50 | Absent | 54 | Absent | 120 | 130 |
| 2 | 28 | Absent | 33 | Absent | 42 | Absent | 127 | 141 |
| 3 | 24 | Absent | 25 | Absent | 33 | Absent | 133 | 150 |
| 4 | 10 | Absent | 15 | Absent | 21 | Absent | 143 | 164 |
| 5 | 8 | Absent | 10 | Absent | 14 | Absent | 150 | 175 |
| 6 | 5 | Absent | 8 | Absent | Peeling | — | 156 | 183 |
| 7 | 20 | Absent | 26 | Absent | 31 | Absent | 133 | 150 |
| 8 | 23 | Absent | 25 | Absent | 34 | Absent | 133 | 150 |
| 9 | 29 | Absent | 33 | Absent | 42 | Absent | 150 | 175 |
| 10 | 22 | Absent | 30 | Absent | 38 | Absent | 150 | 175 |
| 11 | 20 | Absent | 25 | Absent | 30 | Absent | 133 | 150 |
| 12 | 18 | Absent | 28 | Absent | 35 | Absent | 133 | 150 |
| 13 | 20 | Absent | 29 | Absent | 38 | Absent | 133 | 150 |
| 14 | (Occurence of Cracking) | — | — | — | — | — | — | — |
| 15 | | — | — | — | — | — | — | — |
| 16 | | — | — | — | — | — | — | — |
| 17 | | — | — | — | — | — | — | — |
| 18 | | — | — | — | — | — | — | — |
| 19 | (Occurence of Peeling) | Present | — | — | — | — | — | — |
| 20 | | Present | — | — | — | — | — | — |
| 21 | | Present | — | — | — | — | — | — |
| 22 | | Present | — | — | — | — | — | — |
| 23 | | Present | — | — | — | — | — | — |

3. Evaluation Results

Experimental examples 1 to 10 are examples in which a polyimide resin was used as the first layer and the intermediate layer and an epoxy-acryl mixed resin was used as the second layer. In each of Experimental examples 1 to 10, no bubble was present, the first layer, the intermediate layer, and the second layer were in hermetic contact with each other, and cracking and peeling were not observed immediately after production (initial stage).

Among them, Experimental examples 1 to 6 are examples in which the thickness of the first layer was fixed to 10 μm, the thickness of the intermediate layer was fixed to 390 μm (the total thickness of the first layer and the intermediate layer was 400 μm), and the thickness of the second layer was changed within the range of 100 to 500 μm. In each of Experimental examples 1 to 6, the amount of warp after the 200° C. soaking was able to be reduced to 50 μm or less. Therefore, it was found that a good adhesion state was able to be maintained between the ceramic substrate and the cooling plate even at 200° C. Also, in Experimental examples 2 to 5, the thickness of the second layer was 150 to 400 μm. In each of them, the amount of warp after the 250° C. soaking was able to be reduced to 50 μm or less. Therefore, it was found that a good adhesion state was able to be maintained between the ceramic substrate and the cooling plate even at 250° C. In this regard, it is considered that in Experimental example 1, the thickness of the second layer was small and, thereby, the stress was not able to be sufficiently relaxed by the 250° C. soaking. Also, it is considered that in Experimental example 6, the thickness of the second layer was large, the cooling effect of the cooling plate was not exerted to the portion in the vicinity of the intermediate layer, the heat-resistant temperature (183° C. by calculation) was exceeded during the 250° C. soaking so as to cause embrittlement and, as a result, peeling occurred between the second layer and the intermediate layer.

Experimental examples 7 and 8 are examples in which the thickness of the second layer was fixed to 200 μm, and the thicknesses of the first layer and the intermediate layer were set appropriately so that the total thickness became 400 μm. In each of them as well, the amounts of warp after the 200° C. soaking and the 250° C. soaking were able to be reduced to 50 μm or less as in Experimental examples 2 to 5. Therefore, it was found that a good adhesion state was able to be maintained between the ceramic substrate and the cooling plate even at 200° C. and 250° C.

Experimental examples 9 and 10 are examples in which the thickness of the first layer was fixed to 10 μm, the thicknesses of the intermediate layers were set at 140 μm and 190 μm, respectively, and the thicknesses of the second layers were set at 150 μm and 200 μm, respectively. In each of them as well, the amounts of warp after the 200° C. soaking and the 250° C. soaking were able to be reduced to 50 μm or less as in Experimental examples 2 to 5. Therefore, it was found that a good adhesion state was able to be maintained between the ceramic substrate and the cooling plate even at 200° C. and 250° C.

Experimental examples 11 to 13 are examples in which the material in Experimental example 3 was changed. Experimental example 11 was the same as Experimental example 3 except that the intermediate layer was a PEEK resin, Experimental example 12 was the same as Experimental example 3 except that the first layer was an epoxy resin, and Experimental example 13 was the same as Experimental example 3 except that the first layer was an epoxy resin and the intermediate layer was a PEEK resin. In each of Experimental examples 11 to 13 as well, the amounts of warp after the 200° C. soaking and the 250° C. soaking were able to be reduced to 50 μm or less as in Experimental example 3. Therefore, it was found that a good adhesion state was able to be maintained between the ceramic substrate and the cooling plate even at 200° C. and 250° C.

Experimental examples 14 to 18 are examples in which the adhesive layer was formed from only the first layer composed of the heat-resistant resin (that is, a single layer). Experimental examples 14 and 15 are examples in which the first layer was a polyimide resin and the thicknesses were set at 50 μm and 400 μm, respectively. Experimental examples 16 to 18 are examples in which the first layer was an epoxy resin and the thicknesses were set at 50 μm, 200 μm, and 400 μm, respectively. In each of Experimental examples 14 to 18, cracking occurred immediately after production (initial stage). It is considered that in the case where the adhesive layer was formed from only the first layer composed of the heat-resistant resin, as described above, the resin had a high modulus of elasticity and low flexibility, a difference in thermal expansion between the ceramics and the cooling plate was not able to be absorbed, and cracking occurred.

Experimental examples 19 to 23 are examples in which the adhesive layer was formed from the first layer composed of the heat-resistant resin and the second resin composed of the flexible resin (that is, two layers). Experimental examples 19 and 20 are examples in which the first layer was a polyimide resin, the thicknesses were set at 50 μm and 400 μm, respectively, the second layer was an epoxy-acryl mixed resin, and the thickness was 200 μm. Experimental examples 21 to 23 are examples in which the first layer was an epoxy resin, the thicknesses were set at 50 μm, 200 μm, and 400 μm, respectively, the second layer was an epoxy-acryl mixed resin, and the thickness was 200 μm. In each of Experimental examples 19 to 23, peeling occurred between the first layer and the second layer immediately after production (initial stage). The cause of the peeling is considered to be presence of bubbles between the first layer and the second layer. In production of the sample, a layer of the uncured polyimide adhesive, which was the layer of first layer precursor, was formed on the ceramic substrate and a layer of the uncured epoxy-acryl adhesive, which was the layer of second layer precursor, was formed on the cooling plate. The shapes of these two layers were unstable and, therefore, when the two were heated while being in contact with each other, bubbles remained easily.

Among Experimental examples 1 to 23 described above, Experimental examples 1 to 13 correspond to the examples according to the present invention and Experimental examples 14 to 23 correspond to comparative examples. In this regard, in Experimental examples 1 to 10, substantially the same results were obtained in the case where an epoxy resin (judged to be a heat-resistant resin) instead of the polyimide resin was used as the heat-resistant layer.

The present application claims priority from U.S. Provisional Application No. 62/045,745 filed on Sep. 4, 2014, the entire contents of which are incorporated herein by reference.

Note that, needless to say, the above-described experimental examples do not limit the present invention.

What is claimed is:

1. A wafer holder comprising a resin adhesive layer between a ceramic electrostatic chuck and a metal cooling plate, wherein the adhesive layer includes a first layer in contact with the electrostatic chuck, a second layer in contact with the cooling plate, and an intermediate layer located between the first layer and the second layer, heat resistance of each of the first layer and the intermediate layer is higher than heat resistance of the second layer, flexibility of the second layer is higher than flexibility of each of the first layer and the intermediate layer, and the layers are in hermetic contact with each other.

2. The wafer holder according to claim 1, wherein a modulus of elasticity of the second layer at room temperature is smaller than a modulus of elasticity of each of the first layer and the intermediate layer.

3. The wafer holder according to claim 1, wherein the second layer is an epoxy-acryl mixed resin layer and has a shear modulus of elasticity Z (MPa) at room temperature satisfying 0.048≤Z≤2.350.

4. The wafer holder according to claim 1, wherein the first layer and the intermediate layer are each a polyimide resin layer, an epoxy resin layer, or a PEEK resin layer exhibiting heat resistance at 200° C., and the second layer is an epoxy-acryl mixed resin layer.

5. The wafer holder according to claim 4, wherein the first layer and the intermediate layer are each a polyimide resin layer, an epoxy resin layer, or a PEEK resin layer exhibiting heat resistance at 250° C.

6. The wafer holder according to claim 1, wherein a thickness of the second layer is smaller than a total thickness of the first layer and the intermediate layer and is 150 to 400 μm.

7. A method for manufacturing the wafer holder according to claim 1, comprising forming a layer of first layer precursor, which becomes the first layer through thermal curing, on one surface of the electrostatic chuck, forming a layer of second layer precursor, which becomes the second layer through thermal curing, on one surface of the cooling plate, forming a laminate by sandwiching a thermally cured flat resin sheet, which corresponds to the intermediate layer, between the layer of first layer precursor on the electrostatic chuck and the layer of second layer precursor on the cooling plate, and thermally curing the layer of first layer precursor and the layer of second layer precursor by putting the laminate into a bag, decompressing the inside of the bag, and pressurizing and heating the bag from the outside.

8. The method for manufacturing the wafer holder, according to claim 7, wherein the layer of second layer precursor is a layer of an adhesive material containing (A) an epoxy resin capable of performing hydrogen transfer polyaddition, (B) a polymer of acrylic acid ester or methacrylic acid ester, and (C) a curing agent.

* * * * *